United States Patent
Zhang

(10) Patent No.: US 10,175,327 B2
(45) Date of Patent: Jan. 8, 2019

(54) IMAGE RECONSTRUCTION METHOD AND DEVICE FOR A MAGNETIC RESONANCE IMAGING SYSTEM

(71) Applicant: Siemens Aktiengesellschaft, Munich (DE)

(72) Inventor: Qiong Zhang, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 975 days.

(21) Appl. No.: 14/630,995

(22) Filed: Feb. 25, 2015

(65) Prior Publication Data

US 2015/0309150 A1    Oct. 29, 2015

(30) Foreign Application Priority Data

Feb. 28, 2014   (CN) .......................... 2014 1 0071890

(51) Int. Cl.
*G01R 33/561*   (2006.01)

(52) U.S. Cl.
CPC ................................ *G01R 33/5611* (2013.01)

(58) Field of Classification Search
CPC .................................................. G01R 33/5611
See application file for complete search history.

(56) References Cited

U.S. PATENT DOCUMENTS

| | | | | |
|---|---|---|---|---|
| 4,899,109 A * | 2/1990 | Tropp | ................. | G01R 33/3875 324/319 |
| 5,910,728 A * | 6/1999 | Sodickson | ......... | G01R 33/3815 324/309 |
| 6,160,397 A * | 12/2000 | Washburn | ........ | G01R 33/56554 324/307 |
| 6,841,998 B1 * | 1/2005 | Griswold | ........... | G01R 33/5611 324/309 |
| 7,250,762 B2 * | 7/2007 | King | .................. | G01R 33/5617 324/307 |
| 7,952,351 B2 * | 5/2011 | King | ................ | G01R 33/56518 324/307 |
| 8,148,983 B2 * | 4/2012 | Biber | ................. | G01R 33/3415 324/309 |
| 8,319,495 B1 * | 11/2012 | Zhu | .................... | G01R 33/5612 324/307 |
| 8,594,400 B2 * | 11/2013 | Darrow | ................ | G01R 33/543 382/128 |
| 9,396,562 B2 * | 7/2016 | Lefebvre | ............... | G06T 11/005 |
| 9,482,732 B2 * | 11/2016 | Chesneau | .......... | G01R 33/4824 |

\* cited by examiner

*Primary Examiner* — Dixomara Vargas

(74) *Attorney, Agent, or Firm* — Schiff Hardin LLP

(57) ABSTRACT

In an image reconstruction method and device for a magnetic resonance imaging system, a magnetic resonance scan is performed at least one scan position according to at least one scan protocol, to acquire at least a set of one scan protocol simultaneously acquired data. At least one magnetic resonance image is reconstructed based on the set of scan protocol simultaneously acquired data and a shared receiving coil calibration matrix. By sharing the receiving coil calibration matrix in different parallel scan processing operations, the amount of work is significantly reduced while improving working efficiency, and imaging quality can also be significantly improved in the case of scan sequences with echo chain acquisition.

10 Claims, 4 Drawing Sheets

IMAGE RECONSTRUCTION METHOD AND DEVICE FOR A MAGNETIC RESONANCE IMAGING SYSTEM

BACKGROUND OF THE INVENTION

Field of the Invention

The present invention relates to the field of magnetic resonance imaging, in particular to an image reconstruction method and device for a magnetic resonance imaging system.

Description of the Prior Art

Magnetic resonance imaging (MRI) is an imaging technology involving biomagnetics and nuclear spin that has advanced rapidly with the development of computer technology, electronic circuit technology and superconductor technology. It uses a magnetic field and radio frequency (RF) pulses to induce oscillation of precessing hydrogen nuclei (i.e. H+) in human tissue, so as to generate RF signals that are processed by a computer to form an image. If an object is placed in a magnetic field and irradiated by suitable electromagnetic waves to produce resonance therein, and electromagnetic waves released thereby are then analyzed, it is possible to identify the positions and types of the atomic nuclei of which the object is composed. On this basis, a precise three-dimensional image of the interior of the object can be made. For instance, a moving picture of contiguous slices can be obtained by performing an MRI scan of the human brain, starting at the crown and continuing all the way to the base.

In the field of MRI, parallel imaging techniques have gradually developed from research prototypes into clinical tools. By the spatial arrangement of phased array receiving coils, parallel imaging can accelerate the acquisition of magnetic resonance data, reduce scan times and improve diagnostic functionality. Parallel imaging techniques include the sensitivity encoding (SENSE) technique and simultaneous acquisition of spatial harmonics (SMASH) technique. All parallel imaging techniques require a clear reference line or calibration scan in order to calculate a calibration matrix that represents a receiving coil sensitivity map, this calibration matrix then being used in a subsequent image reconstruction process.

FIG. 1 is a schematic diagram of the processing involved in an MRI clinical examination in the prior art. As FIG. 1 shows, first a localizer scan (L) is performed, followed by a first scan protocol (P1), a second scan protocol (P2), a third scan protocol (P3) and a fourth scan protocol (P4) in sequence. Each scan protocol comprises a step (C) of calculating a receiving coil calibration matrix and a step (PA) of parallel acquisition of data. In step (C), the calibration data can be divided into assumed missing data and surrounding data of assumed missing data, and the receiving coil calibration matrix can then be calculated according to the assumed missing data and surrounding data of assumed missing data.

There are generally multiple scan protocols; if a receiving coil calibration matrix is calculated for every scan protocol, there will be a significant amount of calculation to be done, and working efficiency will be reduced.

SUMMARY OF THE INVENTION

An object of the present invention is to provide an image reconstruction method for an MRI system, to improve working efficiency.

Another object of the present invention is to provide an image reconstruction device for an MRI system, to improve working efficiency.

The first object is achieved in accordance with the invention by an image reconstruction method for an MRI system, wherein multiple magnetic resonance scans are performed respectively at multiple scan positions, each respectively according to at least one scan protocol, in each of said multiple scans, acquiring a set of scan protocol simultaneously acquired data wherein the data in each set are simultaneously acquired using multiple receiving coils, and reconstructing a magnetic resonance image from at least one of the scan protocol simultaneously acquired data sets and using a shared receiving coil calibration matrix that is shared among at least two of said sets of scan protocol simultaneously acquired data, to reconstruct the image.

The step of performing multiple magnetic resonance scans can include performing a first magnetic resonance scan at a first scan position according to a first scan protocol, and then the step of acquiring multiple scan protocol simultaneously acquired data sets includes comprises: acquiring a first receiving coil calibration matrix and simultaneously acquiring a first scan protocol data set corresponding to the first magnetic resonance scan, and setting that first receiving coil calibration matrix as the shared receiving coil calibration matrix.

The method can alternatively include setting a known receiving coil calibration matrix as the shared receiving coil calibration matrix.

The method can alternatively include performing a preset magnetic resonance scan on a preset scan position according to a preset scan protocol, and acquiring a receiving coil calibration matrix corresponding to the preset magnetic resonance scan, and setting the acquired receiving coil calibration matrix as the shared receiving coil calibration matrix.

The method can further include performing a localizer scan to acquire a coarse localization image, and determining at least one of the scan positions in the coarse localization image.

An image reconstruction device for an MRI system according to the invention has an MR data acquisition unit (scanner) operable as a parallel scan unit, and a reconstruction unit.

The second object is achieved in accordance with the invention by an image reconstruction device for an MRI system, wherein a control computer operates an MR scanner to perform multiple magnetic resonance scans respectively at multiple scan positions, each respectively according to at least one scan protocol. In each of said multiple scans, a set of scan protocol simultaneously acquired data is acquired wherein the data in each set are simultaneously acquired using multiple receiving coils of the MR scanner. A magnetic resonance image is reconstructed in an image reconstruction computer from at least one of the scan protocol simultaneously acquired data sets and using a shared receiving coil calibration matrix, which is shared among at least two of said sets of scan protocol simultaneously acquired data, to reconstruct the image.

The scanner of the image reconstruction device can also be operated as a localizer scan unit, for performing a localizer scan to acquire a coarse localization image, and to determine at least one of the scan positions from the coarse localization image.

The image reconstruction device can also have a storage unit, for storing the shared receiving coil calibration matrix.

The image reconstruction device can also have a setting unit that sets the image reconstruction device to operate in a selected manner.

The image reconstruction device can also have a receiving coil state detection unit that detects a state of the receiving coil that, and when the receiving coil experiences a change of state, sends a state change message to the setting unit. The setting unit thereupon sets operation of the image reconstruction device according to the state change message.

From the technical solution described above it can be seen that in the embodiments of the present invention, a magnetic resonance scan is performed respectively at least one scan position according to at least one scan protocol, at least one set of scan protocol simultaneously acquired data is acquired respectively, at least one magnetic resonance image is reconstructed respectively based on the set of scan protocol simultaneously acquired data and a shared receiving coil calibration matrix. By sharing the receiving coil calibration matrix in different parallel scan processing operations in the embodiments of the present invention, the amount of work is significantly reduced while improving working efficiency.

Furthermore, in the case of certain sequences with echo chain acquisition (e.g. EPI, SPACE, HASTE etc.), the imaging quality is also significantly improved when the embodiments of the present invention are applied.

DESCRIPTION OF THE PREFERRED EMBODIMENTS

Figure 1:
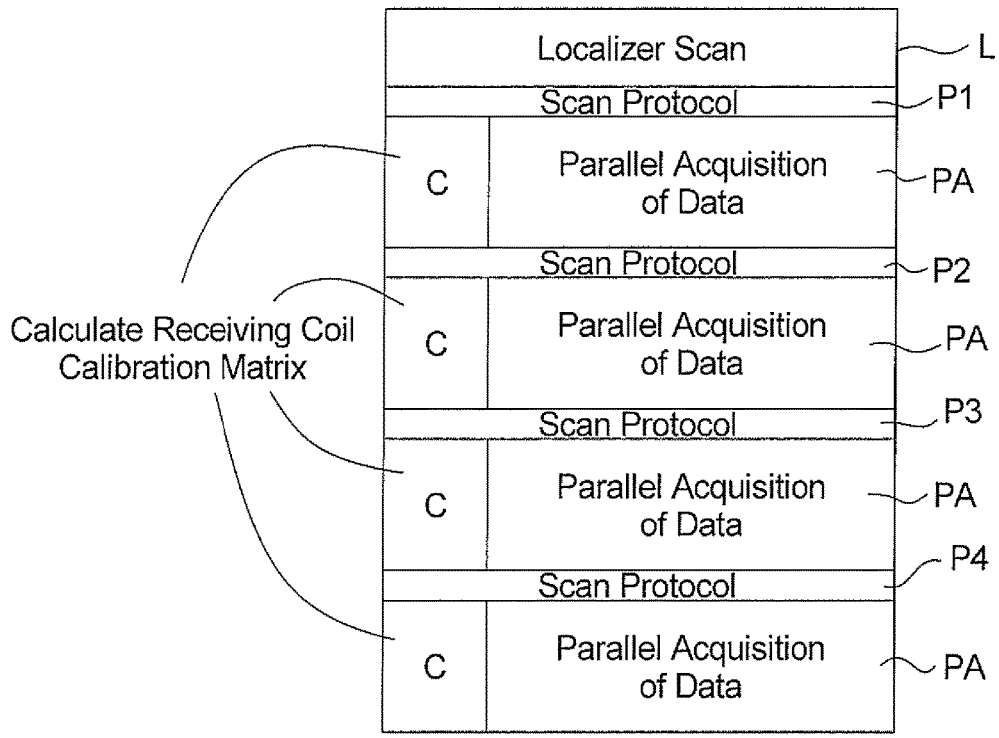
FIG. 1 is a schematic diagram of the processing involved in an MRI clinical examination in the prior art.

The present invention is explained in further detail below with reference to embodiments and the accompanying drawings, to clarify the technical solution and advantages thereof. It should be understood that the particular embodiments described here are merely intended to illustrate the present invention elaboratively, not to define the scope of protection thereof.

To make the description concise and visual, the solution of the present invention is explained below by describing a number of representative embodiments. Some details in the embodiments are merely intended to assist in understanding the solution of the present invention, and the technical solution of the present invention need not be restricted to these details when implemented.

In the embodiments of the present invention, based on the insight that in magnetic resonance scan image processing, a receiving coil calibration matrix (e.g. receiving coil sensitivity map or convolution kernel) remains stable within a certain time range, a calibration matrix is shared by different scan processing operations, with no need to calculate a calibration matrix separately for each individual scan processing operation, so that the amount of work can be reduced significantly, while working efficiency is improved.

In the embodiments of the present invention, a magnetic resonance scan is performed respectively at least one scan position according to at least one scan protocol, at least one set of scan protocol simultaneously acquired data is acquired, then at least one magnetic resonance image is reconstructed based on the set of scan protocol simultaneously acquired data and a shared receiving coil calibration matrix.

The shared receiving coil calibration matrix may be acquired in more than one way.

For example: at the time of a first magnetic resonance scan, a first scan position can be subjected to a first magnetic resonance scan according to a first scan protocol, to acquire a receiving coil calibration matrix corresponding to the first magnetic resonance scan, then this receiving coil calibration matrix can be set as the shared receiving coil calibration matrix.

As another example, an already-known receiving coil calibration matrix may be set as the shared receiving coil calibration matrix. For instance, a shared receiving coil calibration matrix may be determined from a storage medium in which already-calculated receiving coil calibration matrices are stored. Receiving coil calibration matrices that were calculated in various historical magnetic resonance scans are saved in the storage medium. In each magnetic resonance scan, the calibration data can be divided into assumed missing data and surrounding data of assumed missing data, and the receiving coil calibration matrix can then be calculated according to the assumed missing data and surrounding data of assumed missing data.

As another example, a current magnetic resonance scan is performed at a current scan position according to a preset scan protocol, a receiving coil calibration matrix corresponding to the current magnetic resonance scan is acquired, and this receiving coil calibration matrix is set as the shared receiving coil calibration matrix. In other words, a magnetic resonance scan for acquiring the shared receiving coil calibration matrix can be specially performed according to a current scan protocol.

Several specific ways of implementing the acquisition of a shared receiving coil calibration matrix have been described in detail above, but those skilled in the art will realize that these examples are only exemplary, and are not intended to define the scope of protection of the embodiments of the present invention.

Figure 2:
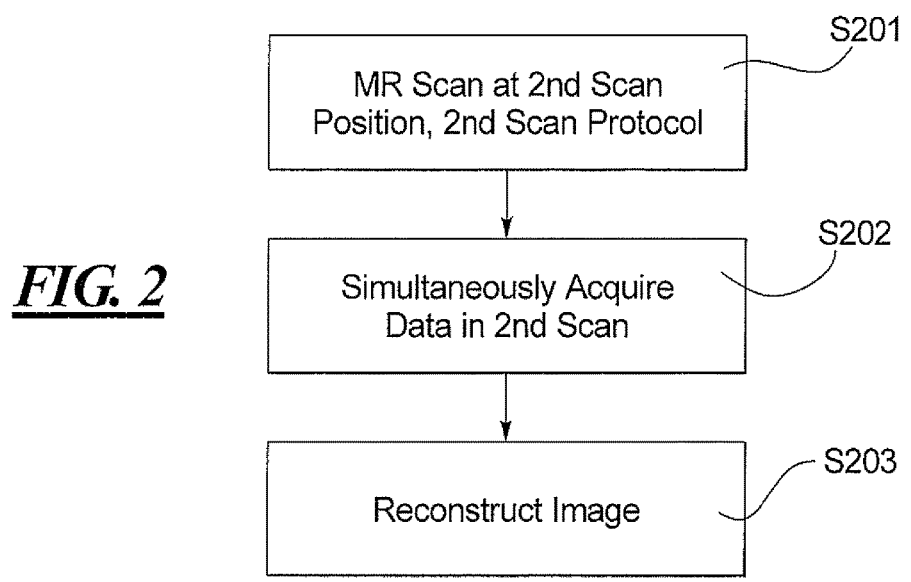
FIG. 2 is a flowchart of the image reconstruction method for an MRI system in an exemplary embodiment of the present invention.

Based on the above explanation, FIG. 2 is an exemplary flowchart of the image reconstruction method for an MRI system of the present invention.

As FIG. 2 shows, the method includes:

Step S201: performing a magnetic resonance scan at a second scan position according to a second scan protocol.

Step S202: acquiring set of second scan protocol simultaneously acquired data.

Step S203: reconstructing an image based on the set of second scan protocol simultaneously acquired data and a shared receiving coil calibration matrix.

In an embodiment:

A magnetic resonance scan can be performed on a first scan position according to a first scan protocol, to acquire the shared receiving coil calibration matrix.

Preferably, in the course of performing a magnetic resonance scan at the first scan position according to a first scan protocol, a set of first scan protocol simultaneously acquired data is further acquired, and an image is reconstructed based on the set of first scan protocol simultaneously acquired data and the shared receiving coil calibration matrix.

In another embodiment:

After completing a magnetic resonance scan corresponding to a second scan protocol, a magnetic resonance scan is performed at a third scan position according to a third scan protocol, a set of third scan protocol simultaneously acquired data is acquired, and an image is reconstructed based on the set of third scan protocol simultaneously acquired data and the shared receiving coil calibration matrix.

Similarly, after completing a magnetic resonance scan corresponding to a third scan protocol, it is also possible to perform a magnetic resonance scan at a fourth scan position according to a fourth scan protocol, acquire a set of fourth scan protocol simultaneously acquired data, and reconstruct an image based on the set of fourth scan protocol simultaneously acquired data and the shared receiving coil calibration matrix, and so on.

In the above procedure, the first scan protocol, second scan protocol, third scan protocol and fourth scan protocol are performed in time sequence one after another. The procedure has been explained using four scan protocols as an example, but those skilled in the art will realize that the number of scan protocol is variable, and is not defined by the embodiments of the present invention.

In one embodiment, the method further includes performing a localizer scan to acquire a localizing rough image, and a technician then determines the first scan position, second scan position, third scan position and/or fourth scan position in the localizing rough image.

The localizer scan specifically includes executing a simple scan protocol, to form one or more simple rough images, to be used for localizing in a particular scan protocol during a clinical scan.

For example, when a first scan protocol is performed, initially a specific scan position is selected from the rough image to serve as a first scan position, and a scan corresponding to the first scan protocol is performed at the first scan position and tomographic data are obtained therefrom. As another example, when a second scan protocol is performed, first a specific scan position is selected from the rough image to serve as a second scan position, and a scan corresponding to the second scan protocol is performed on the second scan position and tomographic data are obtained thereon. Similarly, when a third scan protocol is performed, first a specific scan position is selected from the rough image to serve as a third scan position, and a scan corresponding to the third scan protocol is performed at the third scan position and tomographic data are obtained therefrom. Pairs of scan positions may be the same, or the scan positions may be different from one another. For example, the first scan position may be the same as the second scan position, or different therefrom; the first scan position may be the same as the third scan position, or different therefrom; the second scan position may be the same as the third scan position, or different therefrom, and so on.

Moreover, the scan protocols may the same or different. As another example, the scan protocols may be implemented in different ways. For instance, the scan protocol may specifically comprise:

T2_dess_we_sag_320_1.5 mm scan protocol; T1_vibe_we_ns_sag_iso_256 scan protocol; T2_med3d_we_sag_iso_256 scan protocol, etc.

Some specific scan protocols have been listed above for the sake of demonstration, but those skilled in the art will realize that the examples thus given are purely demonstrative, and are not intended to define the embodiments of the present invention.

In an embodiment, an enabling switch state for sharing a receiving coil calibration matrix is further set. When the enabling switch state is closed, this indicates that there is currently no shared receiving coil calibration matrix capable of being shared; when the enabling switch state is open, this indicates that there is currently a shared receiving coil calibration matrix capable of being shared.

In this case, the method includes, when the enabling switch state for sharing a receiving coil calibration matrix is open, a magnetic resonance scan is performed on a selected scan position according to a preset scan protocol, simultaneously acquired data corresponding to the scan protocol are acquired, and an image is reconstructed based on the simultaneously acquired data and the shared receiving coil calibration matrix.

When the enabling switch state for sharing a receiving coil calibration matrix is closed, a magnetic resonance scan is performed at a selected scan position according to a preset scan protocol (e.g. a first scan protocol). The magnetic resonance scan includes a calibration scan step and a parallel data acquisition step. A receiving coil calibration matrix can be calculated in the calibration scan step. Simultaneously acquired data corresponding to the scan protocol can be acquired in the parallel data acquisition step. The receiving coil calibration matrix calculated in the calibration scan step may be set to be shared, i.e. the enabling switch state for the receiving coil calibration matrix is set to be open. In subsequent image reconstruction for this scan protocol, an image can be reconstructed based on the receiving coil calibration matrix and the simultaneously acquired data corresponding to the scan protocol.

Next, a magnetic resonance scan may be performed at a second scan position according to a second scan protocol. The magnetic resonance scan includes a parallel data acquisition step, but no calibration scan step. Second scan protocol simultaneously acquired data corresponding to the second scan protocol can be acquired by means of the parallel data acquisition step. An image can be reconstructed based on the second scan protocol simultaneously acquired data and the shared receiving coil calibration matrix.

Next, a magnetic resonance scan may be performed at a third scan position according to a third scan protocol. The magnetic resonance scan includes a parallel data acquisition step, but no calibration scan step. Third scan protocol simultaneously acquired data corresponding to the third scan protocol can be acquired by means of the parallel data acquisition step. An image can be reconstructed based on the third scan protocol simultaneously acquired data and the shared receiving coil calibration matrix.

Continuing in sequence, a magnetic resonance scan may be performed at a fourth scan position according to a fourth scan protocol. The magnetic resonance scan includes a parallel data acquisition step, but no calibration scan step. Fourth scan protocol simultaneously acquired data corresponding to the fourth scan protocol can be acquired by means of the parallel data acquisition step. An image can be reconstructed based on the fourth scan protocol simultaneously acquired data and the shared receiving coil calibration matrix.

In fact, the specific number of parallel scan protocols performed can be arbitrary. Moreover, the sequence in which the various parallel scan protocols are performed may also be adjusted correspondingly. The embodiments of the present invention impose no limitations in this respect.

Furthermore, prompt information may preferably be issued to a user each time a parallel scan protocol is performed, to prompt the user as to whether he will continue to use the shared receiving coil calibration matrix, or update the shared receiving coil calibration matrix in the parallel scan being performed on this occasion of his own accord.

In another embodiment, the method further includes detecting the state of a receiving coil, and when the receiving coil experiences a change of state, closing the enabling switch for sharing a receiving coil calibration matrix. For example, a number of sensors may be disposed on the periphery of a receiving coil to detect different operating states of the receiving coil. When the receiving coil operating state changes, it is determined that there is now no reason to continue to share a receiving coil calibration matrix, so the enabling switch for sharing a receiving coil calibration matrix is closed.

Specifically, a position sensor for detecting the positional state of a receiving coil may be disposed on the periphery of the receiving coil; when the position sensor determines that the position of the receiving coil has changed, it is determined that there is now no point in continuing to share a receiving coil calibration matrix, so the enabling switch for sharing a receiving coil calibration matrix is closed.

Figure 3:
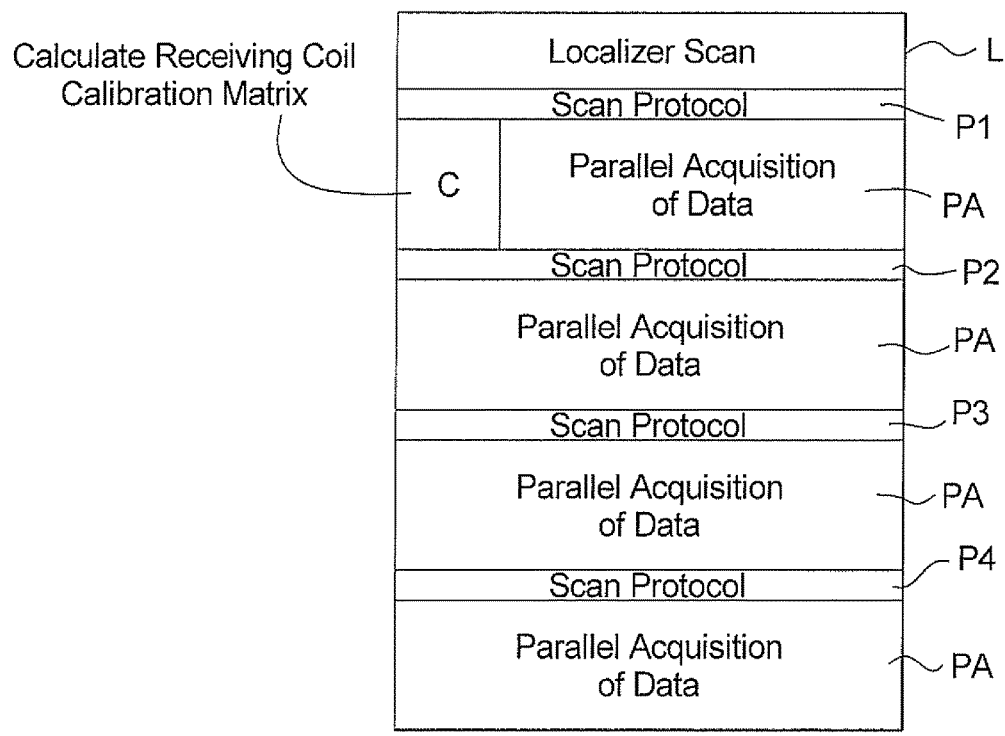
FIG. 3 is a schematic diagram of the processing involved in an MRI clinical examination in the embodiments of the present invention.

FIG. 3 is a schematic diagram of the processing involved in an MRI clinical examination in the embodiments of the present invention.

As FIG. 3 shows, in the embodiments of the present invention, first of all a localizer scan L is performed, then a first scan protocol P1, a second scan protocol P2, a third scan protocol P3 and a fourth scan protocol P4 are performed in sequence.

The first scan protocol performed includes calculating a calibration matrix C and flowed by a parallel acquisition of data PA. The receiving coil calibration matrix that has been calculated is also used as the shared calibration matrix, to be used by a subsequent scan protocol in image reconstruction.

Furthermore, the second scan protocol P2, third scan protocol P3 and fourth scan protocol P4, which are performed in sequence each only contain a step of parallel acquisition of data PA, but no step of calculating a calibration matrix.

Image reconstruction data corresponding to the first scan protocol is derived from first scan protocol simultaneously acquired data and the calibration matrix calculated in the course of first scan protocol processing. In other words, a reconstructed image corresponding to the first scan protocol is calculated based on the first scan protocol simultaneously acquired data and a shared calibration matrix.

Image reconstruction data corresponding to the second scan protocol are derived from a set of second scan protocol simultaneously acquired data and the calibration matrix calculated in the course of first scan protocol processing. In other words, a reconstructed image corresponding to the second scan protocol is calculated based on the set of second scan protocol simultaneously acquired data and the shared calibration matrix.

Image reconstruction data corresponding to the third protocol are derived from third scan protocol simultaneously acquired data and the calibration matrix calculated in the course of first scan protocol processing. In other words, a reconstructed image corresponding to the third scan protocol is calculated based on the third scan protocol simultaneously acquired data and the shared calibration matrix.

Figure 4:
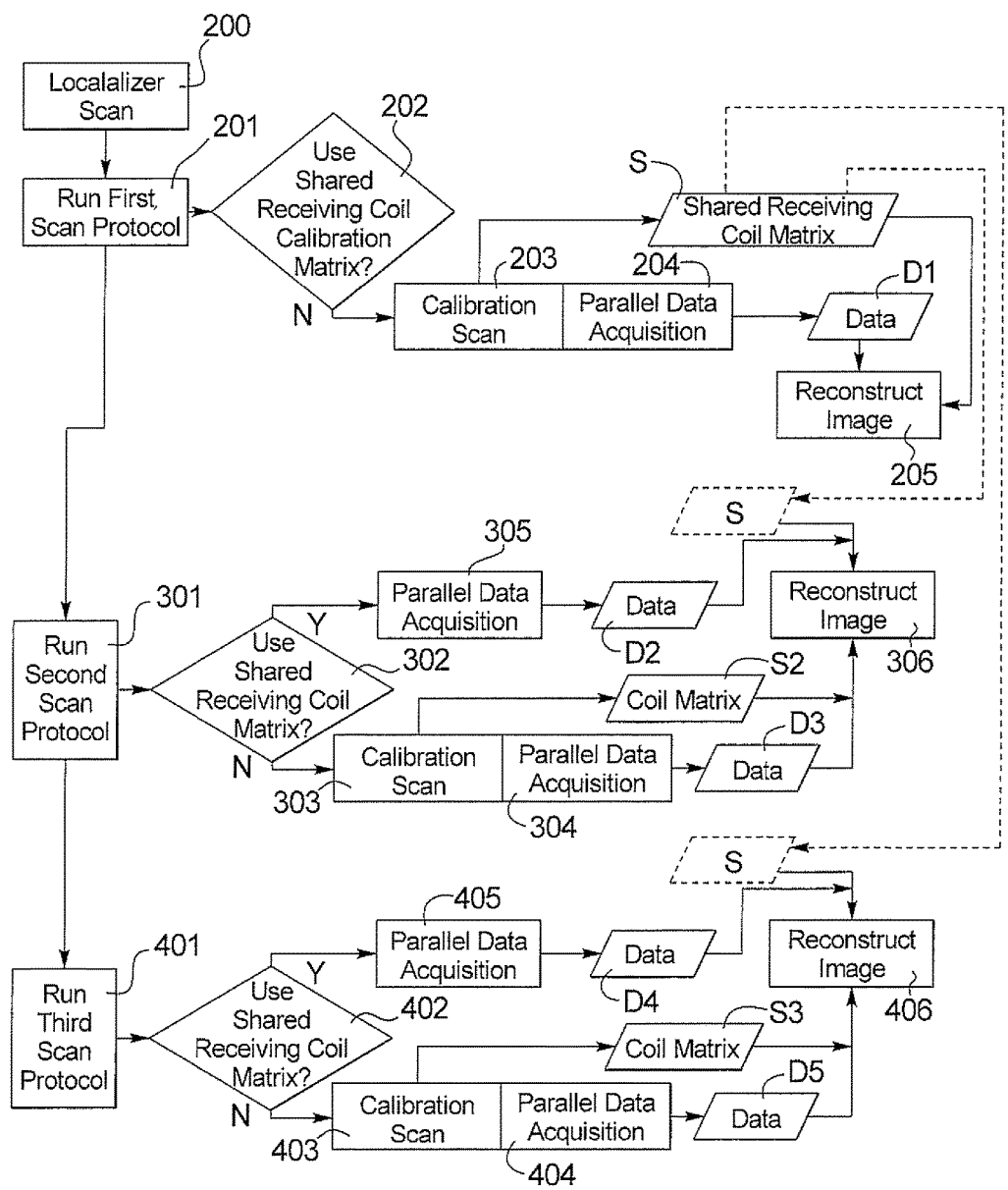
FIG. 4 is a flowchart of the image reconstruction method for an MRI system in another embodiment of the present invention.

Based on the detailed analysis above, FIG. 4 is an exemplary flowchart of the image reconstruction method in the embodiments of the present invention.

As FIG. 4 shows, the method includes:

Step 200: performing a localizer scan on a scan subject, to acquire a rough image to be used for localization with various specific scan protocols in subsequent clinical scans.

Step 201: starting to run a first scan protocol.

Step 202: determining whether to use a shared receiving coil calibration matrix. Here, since the first scan protocol is the specific scan protocol that is run first, there is not as yet any receiving coil calibration matrix to be shared, therefore the determination result is negative, and step 203 is performed.

Steps 203-204: performing a magnetic resonance scan on a first scan position according to the first scan protocol, wherein the first scan position may be selected from the rough image by a user. Here, a calibration scan step 203 and a parallel data acquisition (PAT) step 204 are performed separately, wherein a receiving coil calibration matrix S can be acquired according to the calibration scan step 203, and the calibration matrix S can be shared, and PAT original data D1 corresponding to the first scan protocol can be acquired according to the parallel data acquisition step 204.

Step 205: image information corresponding to the first scan protocol can be reconstructed according to the calibration matrix S and the PAT original data D1 corresponding to the first scan protocol.

Step 301: starting to run a second scan protocol.

Step 302: determining whether to use the shared receiving coil calibration matrix S. Here, a prompt may be issued to the user to allow the user to determine whether to use the shared receiving coil calibration matrix, or the decision whether to use the shared receiving coil calibration matrix may be made based on a receiving coil sensor state. When it is determined that the shared receiving coil calibration matrix S is to be used, step 305 and the steps which follow it are performed; when it is determined that the shared receiving coil calibration matrix S is not to be used, step 303 and the steps which follow it are performed.

Steps 303-304: performing a magnetic resonance scan on a second scan position according to a second scan protocol, wherein the second scan position may be selected from the rough image by a user. Moreover, the second scan position may be the same as the first scan position, or different therefrom. Here, a calibration scan step 303 and a parallel data acquisition (PAT) step 304 are performed separately, wherein a calibration matrix S2 can be acquired according to the calibration scan step 303, and PAT original data D3 corresponding to the second scan protocol can be acquired according to the parallel data acquisition step 304.

Step 305: performing a parallel data acquisition (PAT) process, to acquire PAT original data D2 corresponding to the second scan protocol.

Step 306: when it is determined in step 302 that the shared calibration matrix S is to be used, reconstructing image information corresponding to the second scan protocol according to the shared calibration matrix S and the PAT original data D2 corresponding to the second scan protocol. When it is determined in step 302 that the shared calibration matrix S is not to be used, reconstructing image information corresponding to the second scan protocol according to the calibration matrix S2 and the PAT original data D3 corresponding to the second scan protocol.

Step 401: starting to run a third scan protocol.

Step 402: determining whether to use the shared receiving coil calibration matrix S. Here, a prompt may be issued to the user to allow the user to determine whether to use the shared receiving coil calibration matrix, or the decision whether to use the shared receiving coil calibration matrix may be made based on a receiving coil sensor state. When it is determined that the shared receiving coil calibration matrix S is to be used, step 405 and the steps which follow it are performed; when it is determined that the shared receiving coil calibration matrix S is not to be used, step 403 and the steps which follow it are performed.

Steps 403-404: performing a magnetic resonance scan on a third scan position according to a third scan protocol, wherein the third scan position may be selected from the rough image by the user. Moreover, the third scan position may be the same as the first scan position, or different therefrom. Moreover, the third scan position may be the same as the second scan position, or different therefrom. Here, a calibration scan step 403 and a parallel data acquisition (PAT) step 404 are performed separately, wherein a calibration matrix S3 can be acquired according to the calibration scan step 403, and PAT original data D5 corresponding to the third scan protocol can be acquired according to the parallel data acquisition step 404.

Step 405: performing a parallel data acquisition (PAT) process, to acquire PAT original data D4 corresponding to the third scan protocol.

Step 406: when it is determined in step 402 that the shared calibration matrix S is to be used, reconstructing image information corresponding to the third scan protocol according to the shared calibration matrix S and the PAT original data D4 corresponding to the third scan protocol. When it is determined in step 402 that the shared calibration matrix S is not to be used, reconstructing image information corresponding to the third scan protocol according to the calibration matrix S3 and the PAT original data D5 corresponding to the third scan protocol.

Similarly, it is possible to run a greater number of parallel scan protocols; the embodiments of the present invention impose no limitations in this respect.

By sharing a receiving coil calibration matrix in the different scan processing operations in the embodiments of the present invention, it is possible to eliminate calibration scan steps in subsequent scan processing operations, and thereby save the time consumed by calibration scanning and calibration matrix calculation, in order to significantly improve working efficiency.

Furthermore, in the case of certain sequences with echo chain acquisition (e.g. EPI, SPACE, HASTE etc.), if a shared receiving coil calibration matrix calculated in another scan processing operation is used, image reconstruction quality can be further improved. For example, in the case of scan processing in which an EPI sequence is used, in the prior art, a receiving coil calibration matrix is calculated based on the EPI sequence, and this receiving coil calibration matrix calculated on the basis of the EPI sequence is then used for image reconstruction; in this case the image quality is not good enough. When the embodiments of the present invention are adopted, in the case of scan processing in which an EPI sequence is used, not only is there no need to calculate a receiving coil calibration matrix of one's own accord, but when a shared receiving coil calibration matrix calculated in another scan processing operation can be used (e.g. a FLASH sequence is used in another scan processing operation), the image reconstruction quality can also be significantly improved.

Based on the detailed analysis above, the embodiments of the present invention also encompass an image reconstruction device.

Figure 5:
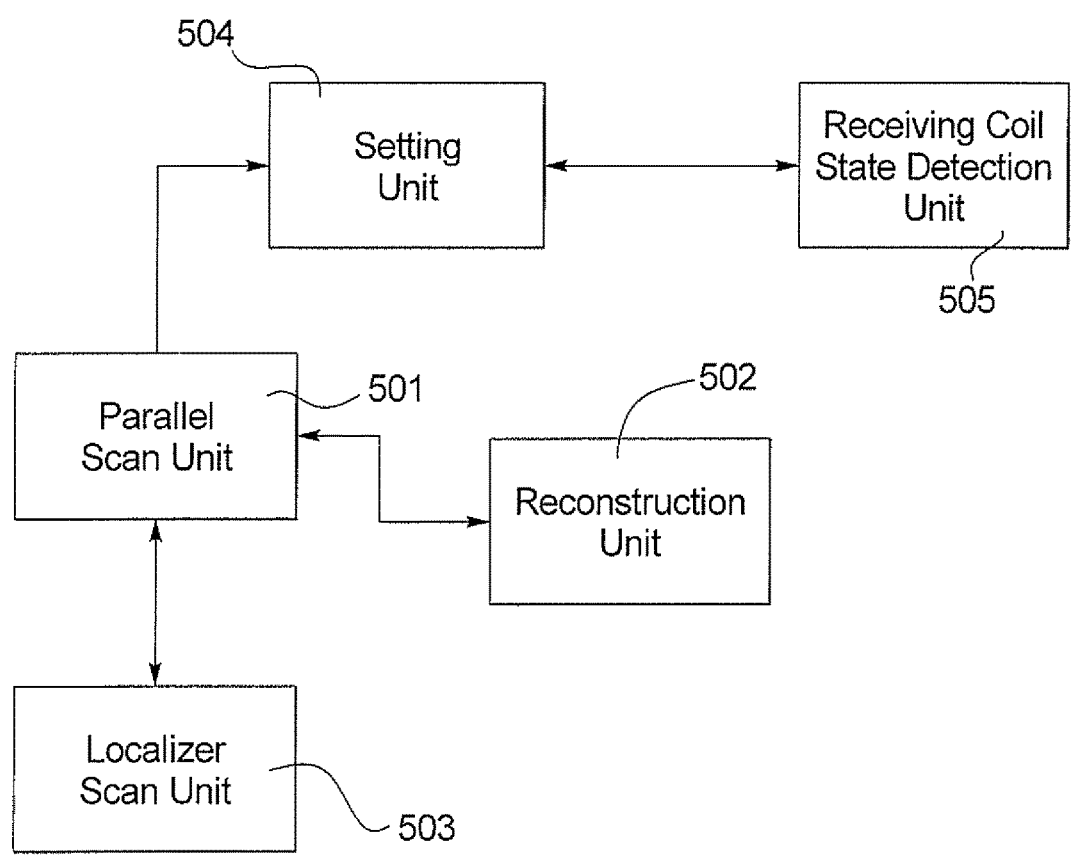
FIG. 5 is a block diagram of the image reconstruction device for an MRI system according to an exemplary embodiment of the present invention.

FIG. 5 is a structural diagram of the image reconstruction device according to the embodiments of the present invention.

As FIG. 5 shows, the image reconstruction device has a parallel scan unit 501 and a reconstruction unit 502.

The parallel scan unit 501 is for performing a magnetic resonance scan respectively at least one scan position according to at least one scan protocol, and acquiring at least one set of scan protocol set of simultaneously acquired data.

The reconstruction unit 502 is designed to reconstruct at least one magnetic resonance image respectively based on the scan protocol set of simultaneously acquired data and a shared receiving coil calibration matrix.

In an embodiment, the parallel scan unit 501 is designed to perform a magnetic resonance scan at a first scan position according to a first scan protocol, to acquire a set of shared receiving coil calibration matrix.

In an embodiment, the parallel scan unit 501 is further designed to acquire a set of second scan protocol simultaneously acquired data in the course of performing a magnetic resonance scan on the second scan position according to a second scan protocol, and the reconstruction unit 502 is designed to reconstruct an image based on the set of second scan protocol simultaneously acquired data and the shared receiving coil calibration matrix.

In another embodiment, the parallel scan unit 501 is designed to perform a magnetic resonance scan at a third scan position according to a third scan protocol, and to acquire a set of third scan protocol simultaneously acquired data, and the reconstruction unit 502 is designed to reconstruct an image based on the third scan protocol simultaneously acquired data and the shared receiving coil calibration matrix.

In another embodiment, the device further includes a localizing scan unit 503, designed to perform a localizing scan to acquire a rough localization image, and to determine at least one said scan position in the rough localization image.

The device may further include a storage unit (not shown), for storing a shared receiving coil calibration matrix. Preferably, all calculated receiving coil calibration matrices may be stored in the storage unit.

In another embodiment, the device further has a setting unit 504, designed to close the image reconstruction device.

In another embodiment, the device further includes a receiving coil state detection unit 505, that detects a state of the receiving coil, and when the receiving coil experiences a change of state, that sends a state change message to the setting unit 504.

The setting unit closes the image reconstruction device according to the state change message.

It should be noted that not all of the steps and modules in the various procedures and structural diagrams mentioned above are necessary. Certain steps or modules may be ignored according to actual requirements. The order in which the various steps are performed is not fixed, but can be adjusted as required. The divisions among modules are based solely on function, to facilitate description; during actual implementation, one module could be realized by multiple modules, or the functions of multiple modules could be realized by the same module. These modules may be located in the same apparatus, or in different apparatuses.

The hardware modules in the various embodiments may be implemented mechanically or electronically. For example, a hardware module may comprise a specially designed permanent circuit or logic device (such as a dedicated processor, like an FPGA or ASIC), for accomplishing a specific operation. A hardware module may also comprise a programmable logic device or circuit which is configured temporarily by software (e.g. including universal processors or other programmable processors), to perform specific operations. With regard to the specific mechanical arrangement employed, a hardware module may be realized using a dedicated permanent circuit or a temporarily configured circuit (e.g. configured by software), depending on considerations of cost and time.

The present invention also encompasses a non-transitory, computer-readable data storage medium on which commands that cause a computer to execute the method described herein are stored. Specifically, a system or apparatus equipped with a storage medium may be provided, wherein software program code realizing the functions of any one of the above embodiments is stored on the storage medium, and a computer (or CPU or MPU) of the system or apparatus reads and executes the program code stored in the storage medium. In addition, an operating system etc. operating on a computer can also be made to complete part or all of an actual operation by means of commands based on the program code. In addition, program code read out from the storage medium can also be written into a memory installed in an expansion board inserted in the computer, or written into a memory installed in an expansion unit connected to the computer, and thereafter commands based on the program code make a CPU etc. installed on the expansion board or expansion unit execute part or all of an actual operation, so as to realize the function of any one of the above embodiments.

Examples of storage media used to provide program code include floppy disks, hard disks, magneto-optical disks, optical disks (e.g. CD-ROM, CD-R, CD-RW, DVD-ROM, DVD-RAM, DVD-RW, DVD+RW), magnetic tape, non-volatile memory cards and ROM. Optionally, program code may be downloaded from a server computer via a communication network.

In summary, in the embodiments of the present invention, a magnetic resonance scan is performed respectively on at least one scan position according to at least one scan protocol; at least one scan protocol simultaneously acquired data are acquired respectively; at least one magnetic resonance image is reconstructed respectively based on the scan protocol simultaneously acquired data and a shared receiving coil calibration matrix. By sharing a receiving coil calibration matrix in different parallel scan protocols in the embodiments of the present invention, the amount of work is significantly reduced while improving working efficiency.

Furthermore, in the case of certain sequences with echo chain acquisition (e.g. EPI, SPACE, HASTE etc.), the imaging quality is also improved when the embodiments of the present invention are applied.

Although modifications and changes may be suggested by those skilled in the art, it is the intention of the inventor to embody within the patent warranted hereon all changes and modifications as reasonably and properly come within the scope of the inventor's contribution to the art.

I claim as my invention:

1. A magnetic resonance (MR) image reconstruction method, comprising:

from a control computer, operating an MR scanner, comprising multiple receiving coils, in order to perform multiple MR scans of an examination subject situated in the MR scanner, respectively at multiple scan positions, with each MR scan being performed according to at least one scan protocol, said multiple receiving coils exhibiting a coil state that exists respectively in each of said MR scans;

operating said MR scanner from said control computer in each of said multiple MR scans so as to acquire MR data from the examination subject simultaneously with said multiple receiving coils, thereby acquiring, for each MR scan, a set of scan protocol simultaneously acquired data that is undersampled and that requires sensitivity data of said multiple receiving coils, represented in a coil calibration matrix, in order to complete the respective undersampled set of scan protocol simultaneously acquired data;

proving an image reconstruction computer with a provided coil calibration matrix;

in said image reconstruction computer, detecting the respective coil states of the multiple reception coils in at least two successive MR scans in said multiple scans that are sufficiently stable between said at least two MR scans so that said provided coil calibration matrix can be used as a shared coil calibration matrix for said at least two MR scans;

in said image reconstruction computer, reconstructing an MR image from the respective sets of scan protocol simultaneously acquired data acquired in said at least two MR scans, by completing each of the respective sets of scan protocol simultaneously acquired data acquired in said at least two MR scans using said shared coil calibration matrix; and making the reconstructed MR image available from said image reconstruction computer, in electronic form, as a data file.

2. An image reconstruction method as claimed in claim 1 comprising, from said control computer, operating said MR scanner to perform said multiple MR scans of said subject including performing a first MR scan of said subject at a first scan position according to a first scan protocol, and acquiring a first receiving coil calibration matrix in said first MR scan, and providing said first receiving coil calibration matrix to said image reconstruction computer as said provided coil calibration matrix.

3. An image reconstruction method as claimed in claim 1 comprising providing a known coil calibration matrix to said image reconstruction computer as said provided coil calibration matrix.

4. An image reconstruction method as claimed in claim 1 comprising before operating said MR scanner to perform said multiple MR scans, operating said MR scanner, from said control computer, to perform a predetermined MR scan of said subject at a predetermined scan position according to a predetermined scan protocol, and acquiring a coil calibration matrix in said predetermined magnetic resonance scan, and providing the coil calibration matrix obtained in said predetermined magnetic resonance scan, in said image reconstruction computer as said provided coil calibration matrix.

5. An image reconstruction method as claimed in claim 1 comprising, prior to operating said MR scanner to perform said multiple MR scans, operating said MR scanner from said control computer to perform a localizer scan and, in said image reconstruction computer, reconstructing a localizer image from said localizer scan, and, in said control computer, determining, from said localizer image, at least one scan position among said multiple scan positions.

6. A magnetic resonance (MR) imaging apparatus comprising:

an MR scanner comprising multiple receiving coils;

a control computer configured to operate said MR scanner in order to perform multiple MR scans of an examination subject situated in the MR scanner, respectively at multiple scan positions, with each MR scan being performed according to at least one scan protocol, said multiple receiving coils exhibiting a coil state that exists respectively in each of said MR scans;

said control computer being configured to operate said MR scanner from said control computer in each of said multiple MR scans so as to acquire MR data from the examination subject simultaneously with said multiple receiving coils, in order to thereby acquire, for each MR scan, a set of scan protocol simultaneously acquired data that is undersampled and that requires sensitivity data of said multiple receiving coils, represented in a coil calibration matrix, in order to complete the respective undersampled set of scan protocol simultaneously acquired data;

an image reconstruction computer provided with a provided coil calibration matrix;

said image reconstruction computer being configured to detect the respective coil states of the multiple reception coils in at least two successive MR scans in said multiple scans that are sufficiently stable between said at least two MR scans so that said provided coil calibration matrix can be used as a shared coil calibration matrix for said at least two MR scans;

said image reconstruction computer being configured to reconstruct an MR image from the respective sets of scan protocol simultaneously acquired data acquired in said at least two MR scans, by completing each of the respective sets of scan protocol simultaneously acquired data acquired in said at least two MR scans using said shared coil calibration matrix; and said reconstruction computer being configured to make the reconstructed MR image available from said image reconstruction computer, in electronic form, as a data file.

7. An image reconstruction device as claimed in claim 6 wherein said control computer is configured to operate said MR scanner to perform said multiple MR scans of said subject including performing a first MR scan of said subject at a first scan position according to a first scan protocol, and acquiring a first receiving coil calibration matrix in said first MR scan, and to provide said image reconstruction computer with said first receiving coil calibration matrix as said provided coil calibration matrix.

8. An image reconstruction device as claimed in claim 6 wherein said image reconstruction computer is configured to use a known receiving coil calibration matrix as said provided coil calibration matrix.

9. An image reconstruction device as claimed in claim 6 wherein said control computer is configured to operate said MR scanner, prior to performing said multiple MR scans, to perform a predetermined MR scan of said subject at a predetermined scan position according to a predetermined scan protocol, and to acquire a coil calibration matrix in said predetermined magnetic resonance scan, and to provide said image reconstruction computer with the coil calibration matrix obtained in said predetermined magnetic resonance scan as said provided coil calibration matrix.

10. An image reconstruction device as claimed in claim 6 wherein said control computer is configured to operate said MR scanner, prior to operating said MR scanner to perform said multiple MR scans, to perform a localizer scan, and wherein said image reconstruction computer is configured to reconstruct a localizer image from said localizer scan, and wherein said control computer is configured to determine, from said localizer image, at least one scan position among said multiple scan positions.

* * * * *